United States Patent
Henriksen et al.

(10) Patent No.: US 12,210,267 B2
(45) Date of Patent: Jan. 28, 2025

(54) FEEDFORWARD DETERMINATION OF A DRIVING SIGNAL FOR A PIEZO ACTUATOR

(71) Applicant: poLight ASA, Skoppum (NO)

(72) Inventors: Lars Henriksen, Tønsberg (NO); Nicolas Tallaron, Neuville sur Saône (FR); Antoine Robert Marie Dalod, Horten (NO)

(73) Assignee: poLight ASA, Skoppum (NO)

( * ) Notice: Subject to any disclaimer, the term of this patent is extended or adjusted under 35 U.S.C. 154(b) by 538 days.

(21) Appl. No.: 17/753,545

(22) PCT Filed: Sep. 8, 2020

(86) PCT No.: PCT/EP2020/075039
§ 371 (c)(1),
(2) Date: Mar. 7, 2022

(87) PCT Pub. No.: WO2021/048103
PCT Pub. Date: Mar. 18, 2021

(65) Prior Publication Data
US 2022/0334452 A1    Oct. 20, 2022

(30) Foreign Application Priority Data

Sep. 10, 2019   (EP) ..................................... 19196408

(51) Int. Cl.
*G01R 35/00*        (2006.01)
*G03B 13/36*        (2021.01)
(Continued)

(52) U.S. Cl.
CPC ............... *G03B 13/36* (2013.01); *H02N 2/06* (2013.01); *H10N 30/802* (2023.02)

(58) Field of Classification Search
CPC ...... G02B 13/0075; G02B 7/08; G03B 13/36; H02N 2/06; H10N 30/802
See application file for complete search history.

(56) References Cited

U.S. PATENT DOCUMENTS

| | | | | |
|---|---|---|---|---|
| 6,046,525 | A * | 4/2000 | Shiozawa ................. | G01J 3/26 |
| | | | | 310/317 |
| 2011/0026151 | A1* | 2/2011 | Shyu ....................... | G02B 7/08 |
| | | | | 359/824 |
| 2015/0285962 | A1* | 10/2015 | Phair ....................... | G03B 3/10 |
| | | | | 29/25.35 |

FOREIGN PATENT DOCUMENTS

EP   3537488 A1   9/2019

OTHER PUBLICATIONS

Gan, Jinqiang et al., "A review of nonlinear hysteresis modeling and control of piezoelectric actuators" AIP Advances, Apr. 2019 pp. 040702-1-040702-10, vol. 9, No. 4.
(Continued)

*Primary Examiner* — Thang X Le
(74) *Attorney, Agent, or Firm* — Knobbe Martens Olson & Bear LLP

(57) ABSTRACT

The invention relates to a method for determining a set-point voltage for a piezoelectric actuator system to achieve a desired optical response of the piezoelectric actuator system, such as an optical power. The method is based on a mathematical model, OP(V,T,n) describing a relationship between the applied voltage and the optical response. Calibration and use of the model involves determining a transition time count value. During use, e.g. at given intervals, the model is updated based on actual values of the temperature and the transition time count value. The set-point voltage required to achieve a desired optical response is determined based on the updated model and the set-point voltage is applied to the piezoelectric actuator.

15 Claims, 3 Drawing Sheets

(51) Int. Cl.
*H02N 2/06* (2006.01)
*H10N 30/80* (2023.01)

(56) References Cited

OTHER PUBLICATIONS

Gomis-Bellmunt, Oriol et al., "Control of a piezoelectric actuator considering hysteresis" Journal of Sound and Vibration, 2009, pp. 383-399, vol. 326.
International Search Report for PCT/EP2020/075039 dated Nov. 23, 2020.

* cited by examiner

FEEDFORWARD DETERMINATION OF A DRIVING SIGNAL FOR A PIEZO ACTUATOR

CROSS REFERENCE TO RELATED APPLICATIONS

This application is a U.S. National Phase Application of PCT International Application Number PCT/EP2020/075039, filed on Sep. 8, 2020, designating the United States of America and published in the English language, which is an International Application of and claims the benefit of priority to European Patent Application No. 19196408.9, filed on Sep. 10, 2019. The disclosures of the above-referenced applications are hereby expressly incorporated by reference in their entireties.

FIELD OF THE INVENTION

The present invention relates to piezoelectric actuator systems, particularly to such systems used optical imagining systems such as compact cameras and smart phones and to the determination of a driving signal for such systems.

BACKGROUND OF THE INVENTION

Piezoelectric actuators offers several advantages which may be utilized in systems requiring high accuracy such as optical systems such as optical imaging systems where the piezo actuators may be used for focusing adjustment of the optical system.

Hysteresis and piezo creep are well known problems of piezoelectric actuators. Piezo creep is the expression of the slow realignment of the crystal domains in a constant input voltage over time. If the operating voltage of a piezoelectric actuator is changed, after the voltage change is complete, the remnant polarization continues to change, manifesting itself in a slow creep. In a feedback setup where the output is repeatedly adjusted based on a comparison of the desired actuator response value with the actual actuator response value possible deviations can be eliminated, thereby compensating the hysteresis and creep effects. However, the feedback system requires accurate and preferable high bandwidth measurement of actuator response in order to realise the feedback setup. This may increase complexity, manufacturing costs and could increase power consumption and system response time.

Thus, there is a need for a piezo actuator system which addresses one or more of these problems.

SUMMARY

It is an object of the invention to improve control of piezoelectric actuators, particularly optical assemblies used in optical assemblies such as optical imaging systems. Thereby it is also an object to improve the accuracy of the response of the piezoelectric actuators, particularly in a feedforward configuration where the control is achieved without real-time measurements of the actuator response.

In a first aspect of the invention there is provided a method for determining a set-point voltage for a piezoelectric actuator system to achieve a desired optical response of the piezoelectric actuator system, such as an optical power, wherein the piezoelectric actuator system comprises an optical member, such as an optical lens, with an adjustable optical response and a piezoelectric actuator, the method comprises providing a mathematical model, $OP(V,T,n)$, describing a relationship between a voltage applied to the piezoelectric actuator, a temperature and a transition time count value as variables and the optical response, where the mathematical model comprises a curve fitting polynomial, and where the transition time count value relates to at least one transition time value of the piezoelectric actuator for changing from a first state to a second state, calibrating the mathematical model by
    determining a calibration transition time count value based on determining the at least one transition time value between the first and second states of the piezoelectric actuator,
    obtaining a calibration temperature of the piezoelectric actuator,
    determining one or more calibration parameters of the mathematical model, $OP(V,T,n)$, based on one or more calibration voltages, and one or more optical responses associated with the one or more calibration voltages applied to the piezoelectric actuator, after a period of time or use of the piezoelectric actuator,
    updating the mathematical model, $OP(V,T,n)$, by
    obtaining the temperature of the piezoelectric actuator,
    determining the transition time count value based on determining the at least one actual transition time value between the first and second states of the piezo electric actuator,
    determining the set-point voltage based on the updated mathematical model, $OP(V,T,n)$, and applying the set-point voltage to the piezoelectric actuator.

Piezoelectric actuators has an electric capacitance and the piezoelectric response depends on capacity. Accordingly, the determination of the transition time count value, which are related to the capacitance, may improve the accuracy of the model.

Furthermore, the relationship between the piezoelectric actuator response and the capacitance is not significantly dependent on the time-dependent polarization of the piezo-material, i.e. the creep effect of the piezoelectric actuator. Thus, including information relating to the capacitance of the piezoelectric actuator in the model, may improve the accuracy of the determined optical response for a given input voltage since the actual creep level is taken into account.

Furthermore, including temperature in the model enables determination of the actuator or optical response that are compensated for variations in temperature.

Advantageously, by determining the set-point voltage to the piezoelectric actuator in order to achieve a desired optical response, may eliminate the need for a closed-loop control of the voltage applied to the piezoelectric actuator and, thereby, eliminating the need for real-time measurements of the optical response.

Whereas the piezoelectric actuator is used in connection with controlling an optical member to control an optical response, the piezoelectric actuator may also be used in connection with other devices which are controllable by the piezoelectric actuator to control other actuator responses.

The set-point voltage or the voltage applied to the piezoelectric actuator relates to the electrical field over the electrodes of the piezoelectric elements, i.e. the internal voltage in the piezoelectric material. The applied voltage may be a voltage in an electrical circuit used for powering the piezoelectric actuator such as an analogue or digital voltage reference for an amplifier, an output voltage of an amplifier, the voltage at the terminals of the piezoelectric actuator or other. Accordingly, the method may be also be seen as a method for determining an electric field over the piezoelectric actuator based on determining a set-point voltage.

According to an embodiment, the relationship describes the optical response for descending and/or ascending values of the voltage. Advantageously, since the piezoelectric response exhibits a hysteresis, the model may advantageously include the response both for descending and ascending values of the voltage, although the model could be based on either the descending or the ascending curve.

According to an embodiment, the relationship solely describes the optical response for descending or ascending values of the voltage. Advantageously, the model is made simpler by including only one of the descending or ascending curves. By including only one of the curves, the hysteresis effect may be addressed by initially applying a maximum or minimum voltage before applying the set-point voltage.

According to an embodiment, determining the transition time count value and the calibration transition time count value comprises determining a first transition time value between the first and second states, and determining a second transition time value between third and fourth states of the piezo electric actuator, wherein the transition time count value and the calibration transition time count value are determined based on a ratio of the first and second transition time values. Advantageously, determining the transition count value based on a ratio of first and second transition time values may reduce a temperature dependency of the transition time count value. Herein, the transition time values may be time values measured in time, a count number or other quantities relating to time.

According to an embodiment, the first and second states comprises first and second steady state voltages resulting based on applying first and second voltages to the piezoelectric actuator.

According to an embodiment, the first steady state voltage is higher than the second steady state voltage and the transition time value is obtained based on a transition from the first steady state voltage to the second steady state voltage. Advantageously, by going from a high steady state voltage to a lower steady state voltage, may result in transition time values which are less dependent on the actual temperature and, thereby, provide more accurate transition time count values. However, the opposite behavior has also been observed so that in other cases going from a lower steady state voltage to a higher is advantageous.

According to an embodiment, the curve fitting polynomial is a predetermined nonlinear function of at least the voltage.

According to an embodiment, the mathematical model comprises the sum of a first term $a(T) \times L(V)$ and a second term $b(T,C)$, where $a(T)$ is a polynomial depending on at least the temperature parameter, a first calibration parameter and the actual temperature, where $L(V)$ is a polynomial of at least 3rd order depending on at least the voltage, and where $b(T,C)$ is a polynomial depending on the temperature parameter, the voltage, a second calibration parameter, the actual temperature and the actual capacitance parameter.

Determining the mathematical model may comprise determining first and second calibration parameters based on the mathematical model, $OP(V,T,n)$, at least first and second calibration voltages, and at least first and second optical responses determined based on the at least first and second calibration voltages applied to the piezoelectric actuator. That is, the first and second optical responses may be the responses from applying the first and second calibration voltages, or oppositely, the first and second calibration voltages may be the voltages which result in desired or predetermined first and second optical responses. As an alternative, a single pair of a single calibration voltage and a single optical response may be utilized for the calibration, or tree or more calibration voltages and corresponding tree or more optical responses.

According to an embodiment, the mathematical model further comprises a term, OPtherm(T), which describes an optical response variation due to temperature dependent components such as lenses in an optical lens system as a function of the temperature, wherein the optical lens system is optically connected with the piezoelectric actuator system.

Advantageously, by including the thermal term, OPtherm(T), the optical response variations of other components may be compensated in by the optical actuator system, i.e. by determining the voltage set-point so that the optical response of the optical member compensates variations in optical responses of the other components.

The optical response variation described by the term OPtherm(T) may be a variation of the optical response of the optical member of the piezoelectric actuator system. In a simple example, the term OPtherm(T) may be a linear function of the temperature, e.g. the temperature used in the mathematical model $OP(V,T,n)$. Thus, for a given temperature, the thermal function OPtherm(T) gives the optical response variation to be compensated by the piezoelectric actuator system via the determination of a voltage set-point.

According to an embodiment, applying the voltage to the piezoelectric actuator comprises initially applying a maximum or a minimum voltage to the piezoelectric actuator for driving the piezoelectric actuator to maximum or minimum deformation, and subsequently applying the set-point voltage to the piezoelectric actuator. Advantageously, by applying an initial maximum or a minimum voltage, a simpler mathematical model $OP(V,T,n)$ may be used since only one of the descending or ascending hysteresis curves may be needed.

According to an embodiment the set-point voltage is determined in an open loop configuration independent on a measurement of an actual optical response.

A second aspect of the invention relates to a piezoelectric actuator system comprising a piezoelectric actuator, a piezo driver arranged to power the piezoelectric actuator, a processing unit arranged to determine a set-point voltage to be applied by the piezo driver to the piezoelectric actuator according to the method of the first aspect and the optical member with an adjustable optical response.

The piezo driver and the processing unit may be separate components or they may be combined into a single component. The piezo driver generally includes amplifier circuits designed to power the piezoelectric actuator. The processing unit may implement the mathematical model, e.g. via a computer program arranged to be executed by a digital processor, and may include other circuits such as a memories for storing e.g. parameters of the mathematical model and e.g. timer circuits for measuring the transition time values.

A third aspect of the invention relates to a piezoelectric actuator system according to the second aspect, wherein the optical member comprises a first transparent cover member,
a second cover member,
a transparent, deformable, non-fluid body sandwiched between the first and second transparent cover members, wherein the one or more piezoelectric elements of the piezoelectric actuator is arranged to generate a controllable change of curvature, displacement and/or orientation of the first or the second cover member.

The second cover member may be transparent, reflective or partially reflective. Thus, light may be transmitted through the optical member, reflected by the optical member or may be partially transmitted and partially reflected. The controllable change of curvature may be used for generating an optical power variation. The change of displacement may be used for generating a displacement of a light beam transmitted through or reflected the optical member. The change of the orientation, such as a change of the angle of the first transparent cover member relative to the second cover member, may be used for generating a change of the propagation direction a light beam transmitted through or reflected by the optical member.

A fourth aspect of the invention relates to a camera module comprising a piezoelectric actuator system according to the second aspect, where the piezoelectric actuator system comprises an optical lens, and where the camera module further comprises and an image sensor arranged to receive the light transmitted through the optical lens.

A fifth aspect of the invention relates to an electronic device comprising the piezoelectric actuator system according to the second aspect.

In general, the various aspects and embodiments of the invention may be combined and coupled in any way possible within the scope of the invention. These and other aspects, features and/or advantages of the invention will be apparent from and elucidated with reference to the embodiments described hereinafter.

BRIEF DESCRIPTION OF THE DRAWINGS

Embodiments of the invention will be described, by way of example only, with reference to the drawings, in which
FIG. 2B illustrates the piezoelectric creep effect which.

DETAILED DESCRIPTION

Figure 1A:
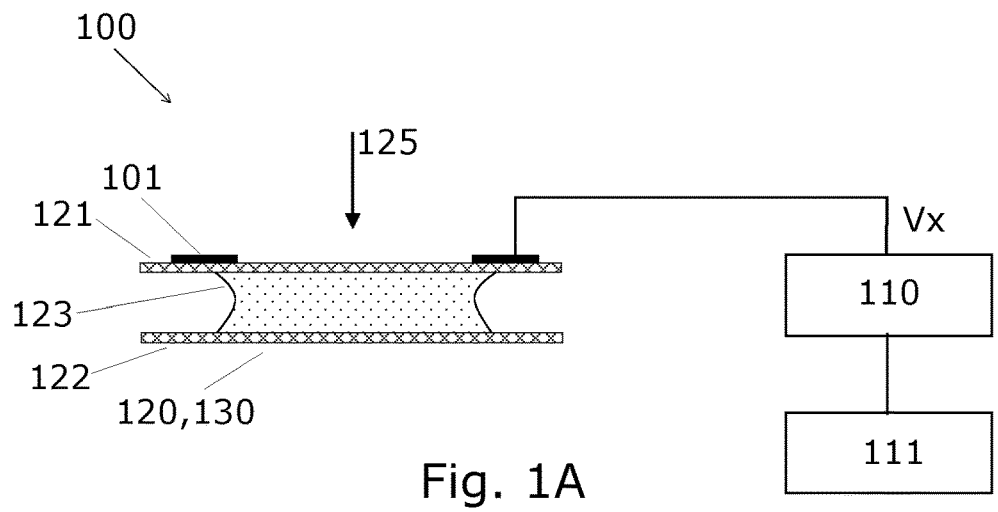
FIG. 1A shows a piezoelectric actuator system.

FIG. 1A shows a piezoelectric actuator system 100 comprising a piezoelectric actuator 101 and an optical lens 120. The optical power of the optical lens can be adjusted by forces or torques generated by the piezoelectric actuator on the optical lens. The piezoelectric actuator system 100 further comprises a piezo driver 110 arranged to power the piezoelectric actuator 100 and a processing unit 111 arranged to determine a set-point voltage Vx to be applied by the piezo driver 110 to the piezoelectric actuator in order to achieve a desired actuator response such as a desired optical power of the optical lens 120. Equivalently, the set-point voltage Vx may be the voltage at the output of the driver 110, an input to the driver or other voltages or analogue or digital references for the voltage applied to the piezoelectric actuator 101. Herein, it is understood that optical power and focal length are equivalent measures.

Figure 1B:
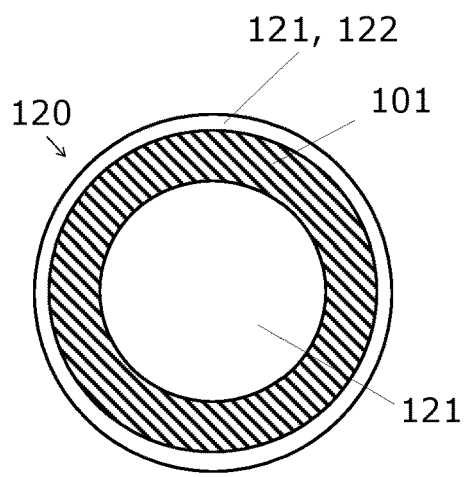
FIG. 1B-1C illustrate top views of the piezoelectric actuator system.
Figure 1C:
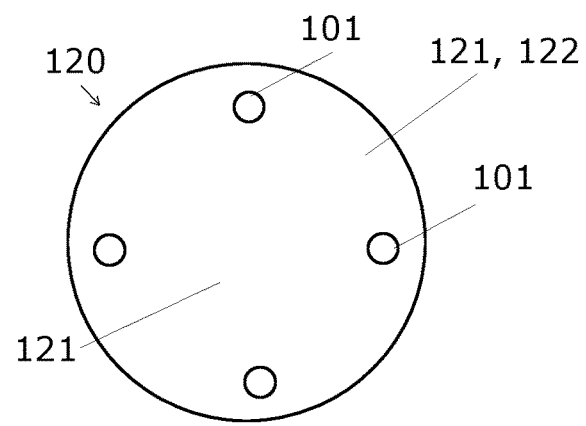

The piezo actuator 101 may comprise one or more piezoelectric elements such as a ring shaped piezo element as shown in FIG. 1B or multiple piezo elements as shown in FIG. 1C which are attached on a surface of the first and/or second transparent cover member 121, 122. Piezo actuators configured in other ways are also feasible. For example, the piezoelectric actuator may be located between the first and second transparent cover members 121, 122 and connected with the inwardly pointing surfaces of the cover members 121, 122.

The optical lens comprises a first transparent cover member 121, a second transparent cover member 122, and a transparent, deformable, non-fluid body 123 sandwiched between the first and second transparent cover members.

The piezoelectric actuator 101 is arranged to generate a controllable change of curvature of the first or the second cover member. By the forces or torques generated by the piezo actuator on the first and/or the second transparent cover member the transparent cover member can be bend into a concave or convex shape and thereby provide an optical power to the incoming light 125.

In general, the piezoelectric actuator system 100 may be configured with an optical member 130, such as the lens 120 or other optical component which provides an optical response such as an optical power. For example, the optical member 130 may be configured as in FIG. 1A with first and second transparent cover members 121, 122, but where the piezo electric actuator 101 is arranged to displace and/or change the orientation of one of transparent cover members 121 relative to the other 122. For example, the piezo electric actuator 101 may be arranged as explained above, between the cover members 121, 122, so that the angle between the two cover members can be changed, e.g. to change the direction of a beam transmitted through the optical member 130. In another example, one of the transparent cover members 121, 122 is replaced with a mirror to provide adjustable beam deflection of the reflected beam. Thus, examples of the optical response includes optical power, change of the direction of the optical axis, and others, including combinations thereof.

Even though some examples herein refers to lenses 120 as comprised by the piezoelectric actuator system 100, the piezoelectric actuator system 100 in general comprises an optical member 130.

FIG. 1B illustrates a top view of the piezoelectric actuator system 100 which comprises a ring shaped piezoelectric actuator 101 arranged to generate bending of the transparent cover member 121.

FIG. 1C illustrates a top view of the piezoelectric actuator system 100 which comprises two or more individually controllable piezoelectric actuators 101.

Figure 1D:
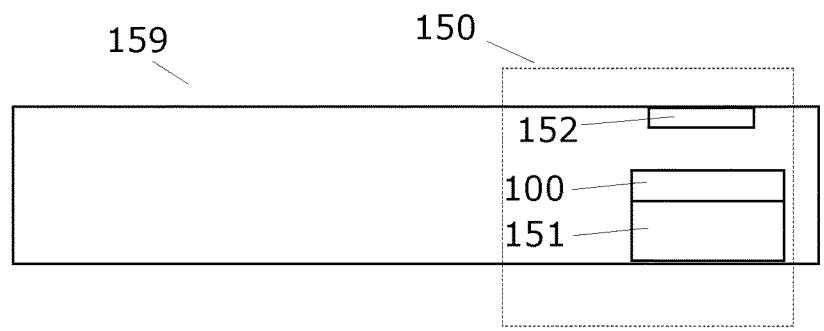
FIG. 1D shows a camera module comprising the piezoelectric actuator system.

FIG. 1D shows a camera module 150 comprising the piezoelectric actuator system 100 and an image sensor 152 arranged to receive the light transmitted through the optical lens of the actuator system. Additional optical components such as fixed optical lenses of an optical lens system 151 may be arranged optically together with the variable lens 120. The purpose of the optical lens system 151 may be to provide additional optical power, correction of optical errors and other optical adaptations. Thus, the optical lens system 151 is optically connected with the piezoelectric actuator system 100. The camera module 150 may be used in an electronic device 159 such as a smart phone.

The transparent, deformable, non-fluid body 123 abuts the inwardly facing surfaces of the first and second transparent cover members 121, 122. As shown in FIGS. 1A-1C, the piezoelectric actuator 101 is arranged so that the lens 120 comprises a portion 121 which constitutes the lens area, surrounded by the piezoelectric actuator 101, so that light can pass unobstructed through the lens area. The non-fluid body 123 is arranged so that it covers at least the lens area, but may also extend beyond the extension of the non-fluid body 123 towards the outer circumference of the first and second transparent cover members 121, 122.

The transparent deformable, non-fluid lens body 123 is preferably made from an elastic material. Since the lens body is non-fluid, no fluid-tight enclosure is needed to hold the lens body, and there is no risk of leakage. In a preferred embodiment, the lens body 123 is made from a soft polymer, which may include a number of different materials, such as silicone, polymer gels, a polymer network of cross-linked or partly cross-linked polymers, and a miscible oil or combination of oils. The elastic modulus of the non-fluid lens body may be larger than 300 Pa, thereby avoiding deformation due to gravitational forces in normal operation. The refractive index of the non-fluid lens body may be larger than 1.3. The non-fluid body 123 may have a refractive index which is equal, substantially equal or close to the refractive index of the transparent cover members 121, 122 in order to reduce reflections at the boundaries of the non-fluid body 123.

The transparent cover members 121, 122 are generally slab-shaped and may have curved or plane surfaces or a combination thereof. The transparent cover members 121, 122 may be made from a large number of different materials, such as acrylics, polyolefins, polyesters, silicones, polyurethanes, glass and others. At least the one of the first and second cover members 121, 122 which is arranged to be deformed by the actuators, has a stiffness and thickness suitable to enable bending by actuation of the piezoelectric actuator 101. In general, the material of the first and/or the second cover member 121, 122 may be formed in a material having a Young's modulus in the range between 5 MPa and 100 GPa to provide the necessary stiffness. For example, Young's modulus for borosilicate glass is 63 GPa, and 72 GPa for fused silica glass.

Figure 2A:
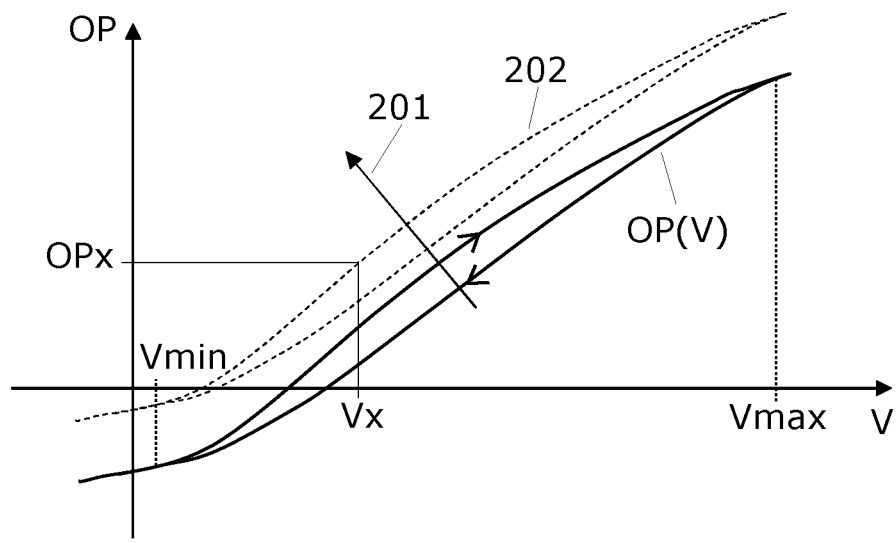
FIG. 2A illustrates a curve OP(V) showing the relationship between optical power OP and voltage V applied to the piezoelectric actuator.

FIG. 2A illustrates a curve OP(V) showing the relationship between optical power OP and voltage V applied to the piezoelectric actuator 101. FIG. 2 shows the hysteresis effect of the piezoelectric actuator where the optical power OP depends on the start and stop voltage V applied to the piezoelectric actuator 101 and that the amount of hysteresis increases with increasing voltage range. It has been observed that the values of optical power OP for descending voltages from a certain maximum voltage Vmax follows the same descending OP(V) curve of the full voltage range Vmin to Vmax. This observation may be utilized for hysteresis compensation according to an embodiment of the invention. The same applies for the ascending curve, so that the same ascending OP(V) curve is followed from a certain minimum voltage Vmin in the full voltage range Vmin to Vmax.

Thus, initially, a maximum or a minimum voltage Vmax, Vmin can be applied to the piezoelectric actuator for driving the piezoelectric actuator to a maximum or minimum deformation or optical power OP. After the maximum or minimum deformation or optical power is reached, a desired set-point voltage Vx is applied to the piezoelectric actuator 101 of the piezoelectric actuator system 100. As will be described below, the set-point voltage Vx is a voltage determined so that the piezoelectric actuator achieves a desired optical power OPx.

Thus, by initially applying a maximum or minimum voltage located above or below the set-point voltage Vx, the transition from the maximum or minimum voltage to the set-point voltage Vx will follow the descending or ascending curve, i.e. the optical power OP for a given voltage V will follow, or substantially follow, the hysteresis curve of OP(V).

The hysteresis curve OP(V), or at least one of the descending or ascending curve parts of OP(V) can be calculated for any given piezoelectric actuator system 101 at any time as described below.

The optical power vs. voltage relationship OP(V) also depends on the temperature T of the piezoelectric actuator 101. The temperature dependency is illustrated by arrow 201 and the curve 202 which is valid for higher temperatures than the temperature valid for solid line OP(V) curve. Thus, the voltage required to obtain a certain optical power OP decreases as the temperature T increases. For the same actuation voltage V, the optical power OP increases as the temperature T increases.

Thus, the thermal drift of the piezoelectric actuator system 100 may imply increasing optical power for increasing temperatures for the same voltage V. This optical power vs. temperature relation is usually in opposite direction to the one of a plastic lens which may be used in the camera module 150 such as in the optical lens system 151. Accordingly, the thermal drift of the piezoelectric actuator 101 may by partially compensated by the thermal drift of the optical lens system 151, or vice versa.

In order to reduce the thermal drift of the piezoelectric actuator system 100 with respect to the optical power, or to achieve or approach a desired thermal drift of the piezoelectric actuator system 100, the optical lens module 151 may be designed so that the thermal drift of the module 151 compensates or partly compensates the thermal drift of the piezoelectric actuator system 100 with respect to the optical power vs. temperature relationship.

Thus, the thermal behavior of the camera module 150 system without the piezoelectric actuator system 100, i.e. the thermal behavior of temperature dependent components of the camera module, such as the fixed optical lens module 151, may be designed, e.g. by choice of materials, dimensions and mechanical design, to obtain optimal performance of the entire camera module 150 or to compensate the thermal dependency of the piezoelectric actuator system 100 over a given operating temperature range.

As described in further details below, this a thermal design may be addressed by means of a mathematical model describing the relationship between optical power OP and voltage V by means of a mathematical term OPtherm(T) which describes the temperature dependency of the optical power OP of temperature dependent components such as the optical lens system 151 as a function of the temperature T.

Figure 2B:
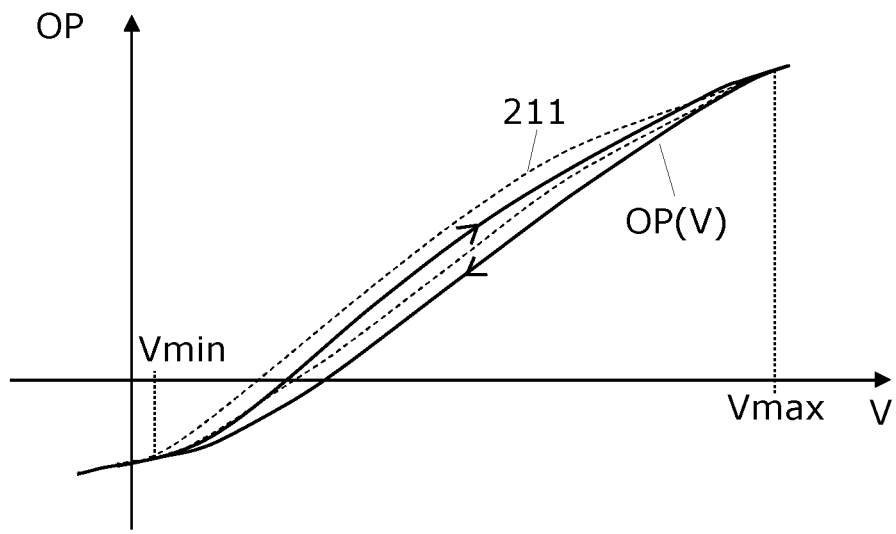

FIG. 2B illustrates the piezoelectric creep effect which is due to a time-dependent polarization of the piezoelectric material in constant electric field. As illustrated by the initial curve OP(V)—similar to OP(V) in FIG. 2A—and the creep effected curve 211, the piezoelectric creep causes an uplift of the OP(V) curve of the piezoelectric actuator system 100, i.e. so that the voltage required to reach a certain optical power decreases. The lower and upper parts of the curve, e.g. portions near the minimum and maximum voltages Vmin, Vmax are not significantly affected by the creep effect. The rate of creep decreases logarithmically with time, so that most of the creep occurs within e.g. the first hour of biasing, where biasing is equivalent to applying a voltage V to the piezoelectric actuator 101. The piezoelectric actuator 101 retains to a certain degree the voltage history. The remnant polarization will gradually decline over time without an applied electric field. In practical applications, however, the creep level of the piezoelectric actuator system 100 will remain if it is used regularly. A piezoelectric actuator system 100 that has experienced some creep, will have less potential for further creep than an unused piezoelectric actuator system 100.

After some time of applying a voltage V, or different voltages V, to the piezoelectric actuator 101, the piezoelectric actuator operates according to the curve 211 which shows smaller hysteresis and improved linearity.

Thus, the use of the piezoelectric actuator 101 to achieve accurate and predictable settings of the optical power OP is complicated by the dependencies of temperature, creep and hysteresis. On the other hand, it has been found that the relationship between the optical power OP and the capacitance of the piezoelectric actuator 101 is constant, or substantially constant, for a given piezoelectric actuator 101 and independent of the voltage biasing history, i.e. the creep effect.

It is noted here, that these dependencies are associated with the piezoelectric elements of the piezoelectric actuator 101. Since the piezoelectric actuator 101 drives the lens 120, it follows that the optical power OP of the piezoelectric actuator system 100 is similarly influenced by these dependencies.

Figure 3A:
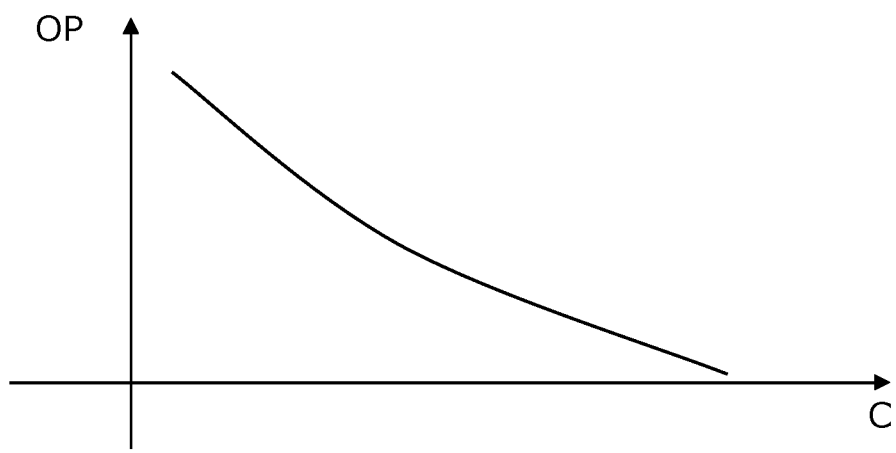
FIG. 3A illustrates the relationship between optical power and the capacitance of the piezoelectric actuator system.

FIG. 3A shows the relationship between optical power OP and the capacitance C of the piezoelectric actuator system 100, i.e. the capacitance of the piezoelectric element(s) of the piezoelectric actuator 101.

Accordingly, by obtaining, via measurements, the capacitance C of the piezoelectric actuator 101 for a given voltage V, this relationship will give the correct information about the optical power at that voltage OP(V), regardless of the level of creep at the measurement moment.

According to an embodiment, the following mathematical model OP(V,T,n) describes the relationship between optical power OP and voltage V for the descending or ascending curve illustrated in FIG. 2A:

$$OP(V,T,n)=a(T){\times}L(V)+b(T,n).$$

Thus, the equation gives the optical power OP for descending or ascending voltages V as the sum of the product term $a(T){\times}L(V)$ and the term $b(T,n)$ and dependent on the variables temperature T and a transition time count value n. The factor $L(V)$ is a curve fitting polynomial.

The mathematical model may be extended to include the term OPtherm(T) as follows:

$$OP(V,T,n)=a(T){\times}L(V)+b(T,n)+OPtherm(T)$$

OPtherm(T) describes the dependency on optical power OP of the temperature T of temperature dependent components such as lenses in an optical lens system 151, i.e. the thermal drift of the temperature dependent components as described above. OPtherm(T) may be obtained by measuring the thermal drift and determining a mathematical representation of the thermal drift as a function of the temperature T.

The transition time count value n relates to a transition time x of the piezoelectric actuator 101 for changing from a first state X1 to a second state X2 of the piezoelectric actuator.

The first and second states X1, X2 may be steady state voltages V1, V2 which results from first and second powering values P1, P2, such as the first and second voltages V1, V2, or first and second charges applied to the piezoelectric actuator. Although, embodiments of the present invention are based on driving the piezoelectric actuator 101 based on voltage controller power signals, this does not exclude driving the piezoelectric actuator 101 based on current or charge controlled power signals. In practice, the voltage signals, such as the first and second voltages V1, V2, as well as the steady state voltages, may be represented by digital or analogue values.

Thus, the voltages V1, V2 may be measured via the electrical connections to the terminals of the piezoelectric actuator 101. The first and second states X1, X2 could also be steady state optical power OP1, OP2—or other optical responses—resulting from applied first and second voltages V1, V2 and measured via an optical detector such as the image sensor 152.

The transition time count value n can be measured in various ways, e.g. by use of a timer which is started in response to starting applying a first voltage value V1 when the actuator 101 is in a known state such as the first state X1 and stopped when the second state X2 is reached in response to a second applied voltage value V2. Any of the first and second voltage values V1, V2 may be a zero value, such as a zero voltage.

The transition time count value n may be a time, a count of an oscillator clock signal or other representations of the transition time.

According to an embodiment, the transition time count value n is determined based on determining a first transition time value x1 between the first and second states X1, X2 resulting from first and second voltage values V1, V2, and determining a second transition time value x2 between third and fourth states X3, X4 of the piezo electric actuator resulting from third and fourth voltage values V3, V4. Based on the first and second transition time value x1, x2, the transition time count value is determined based on the ratio of the first and second transition time values, n=x1/x2.

Thus, the transition time count value n may be determined based on one or more transition time values x1, x2. Advantageously, it was found that the count value n determined from a ratio of transition time values x1, x2 is temperature independent, at least to some degree. A count value n determined from a single transition time value x1 is also feasible, but may require some adaptation of the model OP(V,T,n).

Figure 3B:
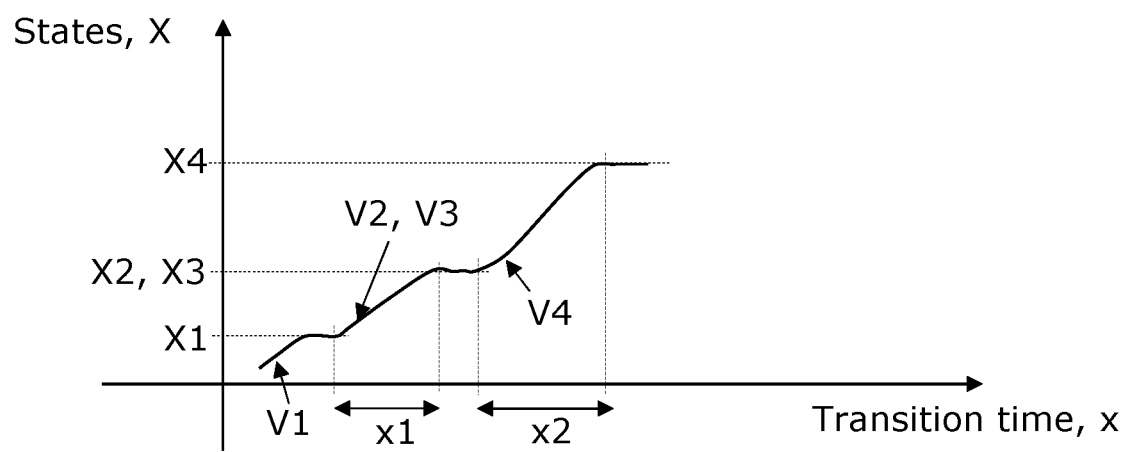
FIG. 3B illustrates an example for the determination of the first and second transition time values.

FIG. 3B illustrates an example for the determination of the first and second transition time values x1, x2. Thus, the determination of the first transition time value x1 is given by the time from the instant when the second voltage value V2 is applied—after the first state X1 is reached in response to the first voltage value V1—to the instant when the second state X2 is reached. The same applies for the determination of the second transition time x2. In FIG. 3B, the second and third voltage values V2, V3 are the same, and consequently the second and third states X2, X3 are the same. The direction of changing between states X1-X4 may be changed so that e.g. the first state X1 has a higher value than the second state X2. Again, any of the voltage powering values V1-V4 may be zero value, such as a zero voltage. Clearly, certain tolerance ranges may be utilized to initiate and stop the time measurements such as a tolerance range for entering the second state X2.

When an oscillator is used for determining the transition time value x, it has been observed that the frequency of the oscillator is temperature dependent in some situations. In order to accurately determine the transition time value, e.g. in ms, the frequency must be stable. However, it has been observed that for transitions from a first high voltage V1 to a lower second voltages V2 of the piezoelectric actuator 101 the determined count value n is well correlated with the capacitance of the piezoelectric actuator 101 and, thereby, the with the optical power OP of the piezoelectric actuator system 100. Accordingly, the transition time value x (or the first and/or second transition times values x1, x2) may be obtained based on a transition from an initially reached first and/or third steady state voltage V1,V3 to a second and/or fourth lower steady state voltage V2,V4.

The relationship between voltage V and optical power OP varies for different piezoelectric actuator systems 100. Therefore, the model OP(V,T,n) needs to be calibrated. The calibration procedure comprises the determination of a calibration transition time count value nCAL. The determination of the calibration transition time count value nCAL follows the procedure described above for the determination of the transition time count value n.

The calibration procedure further comprises obtaining the calibration temperature TCAL of the piezoelectric actuator. The calibration temperature as well as other temperatures of the piezoelectric actuator may be obtained from a temperature sensor comprised by the piezoelectric actuator system 100, or a temperature sensor comprised by the camera module 150 or the electronic device 159.

The calibration further comprises determining one or more optical powers, such as first and second optical powers OP1, OP2 based on corresponding one or more calibration voltages, such as first and second calibration voltages V1, V2, which are applied to the piezoelectric actuator 101.

The optical powers OP1, OP2 may be determined in various ways. For example, a user determined or predetermined distance between a screen placed in front of the camera module 150 and the camera module gives the first optical power OP1, and the first voltage V1 is the voltage which provides a focused image of the screen. The second voltage V2 and optical power OP could be determined similarly based on another distance to the screen. Alternatively, the second optical power OP2 may be the optical power which provides focusing at infinity and the second voltage is the voltage which provides focus at infinity, e.g. a relative large distance such as 10 m.

The calibration may be performed during manufacturing of the camera module 150 or the electronic device 159. Alternatively, the calibration may be performed or repeated by a user of the camera module or the electronic device, e.g. based on an installed calibration algorithm.

The calibration could also be performed based on a statistical approach which may utilize estimated distances to various objects.

The functional values of the curve fitting polynomial L, which is a function such as a nonlinear function of the voltage V, are determined for the one or more calibration voltages. For example, first and second functional values L(V1) and L(V2) may be determined from the first and second calibration voltages V1, V2.

In one example, the curve fitting polynomial L(V) is represented by a 6th order curve fitting polynomial of the form:

$$L(V)=v6 \times V^6+v5 \times V^5+v4 \times V^4+v3 \times V^3+v2 \times V^2+v1 \times V+v0,$$

where v0-v6 are empirically determined coefficients for a given type of a piezoelectric actuator system 100 or piezoelectric actuator 101. L(V) gives the characteristic shape of the OP(V) curve in FIG. 2A, independent of temperature and creep and type of lens used in a piezoelectric actuator system 100. The curve fitting polynomial L(V) may be expressed by polynomials of other order, in general by polynomials of at least 3rd order.

The calibration further comprises determination of one or more calibration parameters aCAL, bCAL by using the mathematical model, OP(V,T,n), the one or more calibration voltages V1, V2 and the one or more optical powers OP1, OP2 associated with the calibration voltages V1, V2. Thus, the calibration parameters are determined based on the model with the calibration voltages and measured optical responses as known input to the mathematical model. The calibration voltages V1, V2 may be determined as voltages that result in desired or predetermined optical responses, e.g. optical powers. Alternatively, the optical response resulting from applying predetermined voltages may be determined. The calibration parameters aCAL, bCAL can be determined from the model OP(V,T,n) wherein a(T) and b(T,n) are independent of the voltage V and by substituting OP1 and OP2 and the first and second functional values L(V1), L(V2), respectively to form two equations OP1(L(V1),T,n) and OP2(L(V2),T,n). Based on the two equations aCAL, bCAL can be determined as:

$$aCAL=(OP1-OP2)/(L(V1)-L(V2)), \text{ and}$$

$$bCAL=OP1(V1)-aCAL \times (L(V1)).$$

The calibration parameters aCAL, bCAL correspond to the behavior of the piezoelectric actuator system 100 at the calibration moment, i.e. for the actual temperature and creep level. With this information, the calibration curve OP(V) for descending or ascending voltages can be constructed.

The determined calibration parameters aCAL, bCAL, nCAL and TCAL are stored, e.g. in a memory of the processing unit 111.

The model OP(V,T,n) can be used for determining the optical power OP for a given voltage V, a given temperature T and a given creep level. This requires that the model parts a(T) and b(T,n) are determined for the actual conditions, i.e. the actual temperature T and the actual transition time count value n. The temperature T can be measured by the temperature sensor as described above and the transition time count value n can be determined as described above, e.g. with the method described in connection with FIG. 3B.

The model parts a(T) and b(T,n) can be expressed with the following polynomials $$a(T)=a2 \times (T^2-TCAL^2)+a1 \times (T-TCAL)+aCAL$$

$$b(T,n)=b2 \times (T^2-TCAL^2)+b1 \times (T-TCAL)+bCAL+ (n-nCAL) \times \Delta b/\Delta n.$$

Clearly, other expressions for a(T) and b(T,n) are also valid such as polynomials of higher order.

The factor $\Delta b/\Delta n$, and the coefficients a1, a2, b1, b2 are empirically determined values.

By means of the mathematical model and the repeated adaptations of the model to actual conditions, set-point voltage Vx can be determined to achieve a desired optical power OPx, as illustrated in FIG. 2A. The set-point voltage Vx may be determined based on an iterative algorithm which determines the voltage V which gives or at least is close to the desired optical power OPx by use if the model OP(V,T,n).

Since the desired optical power OPx can be achieved without measurement of the actual optical power, except in the calibration procedure, the desired optical power OPx is determined in an open loop configuration independent of a measurement of an actual optical power OP.

In the examples above, the model OP(V,T,n) was described in a form where a(T) is dependent on temperature T, and the polynomial L(V) is dependent on voltage V. In other examples, the factor a(T) may further depend on the transition time count value n, i.e. the factor may have the form a(T,N). Similarly, the polynomial may further depend on the transition time count value n and/or the temperature T, i.e. the polynomial may have the form L(V,T,n).

For example, the polynomial could have the form:

$$L(V,T) = v6(T) \times V^6 + v5(T) \times V^5 + v4 \times V^4 + v3 \times V^3 + v2 \times V^2 + v1 \times V + v0 + vT*T^2,$$

or a form L(V,T,n) further including a term which is dependent on n.

In another example, the polynomial L(V) is defined as two or more polynomials L1(V), L2(V) for different temperature ranges. Defining different polynomials L(V) for different temperature ranges, or by defining the polynomial as being dependent on temperature T and/or the transition time count value n, may improve the accuracy in the determined optical power OP for a given voltage V. Since the piezoelectric actuator system 100 is not limited to work with lenses 120, but with optical members 130 in general, it is understood that the optical model OP(V,T,n) applies to other optical responses, e.g. beam deflection. Accordingly, an equivalent model OR(V,T,n) could be formulated for other optical responses. For convenience, the optical model OP(V,T,n) as used herein, applies for any optical response.

Although the present invention has been described in connection with the specified embodiments, it should not be construed as being in any way limited to the presented examples. The scope of the present invention is to be interpreted in the light of the accompanying claim set. In the context of the claims, the terms "comprising" or "comprises" do not exclude other possible elements or steps. Also, the mentioning of references such as "a" or "an" etc. should not be construed as excluding a plurality. The use of reference signs in the claims with respect to elements indicated in the figures shall also not be construed as limiting the scope of the invention. Furthermore, individual features mentioned in different claims, may possibly be advantageously combined, and the mentioning of these features in different claims does not exclude that a combination of features is not possible and advantageous.

The invention claimed is:

1. A method for determining a set-point voltage (Vx) for a piezoelectric actuator system to achieve a desired optical response of the piezoelectric actuator system, wherein the piezoelectric actuator system comprises an optical member with an adjustable optical response (OP) and a piezoelectric actuator, the method comprising:
   providing a mathematical model, OP (V,T,n), describing a relationship between a voltage (V) applied to the piezoelectric actuator, a temperature (T) and a transition time count value (n) as variables and the optical response (OP), wherein the mathematical model comprises a curve fitting polynomial (L), and wherein the transition time count value (n) relates to at least one transition time value (x) of the piezoelectric actuator for changing from a first state (X1) to a second state (X2),
   calibrating the mathematical model by:
      determining a calibration transition time count value (nCAL) based on determining the at least one transition time value (x) between the first and second states (X1, X2) of the piezoelectric actuator,
      obtaining a calibration temperature (TCAL) of the piezoelectric actuator, and
      determining one or more calibration parameters (αCAL, bCAL) of the mathematical model, OP (V,T,n), based on one or more calibration voltages (V1, V2), and one or more optical responses (OP1, OP2) associated with the one or more calibration voltages (V1, V2) applied to the piezoelectric actuator, and
   after a period of time or use of the piezoelectric actuator, updating the mathematical model, OP (V,T,n), by:
      obtaining the temperature (T) of the piezoelectric actuator,
      determining the transition time count value (n) based on determining the at least one actual transition time value (x) between the first and second states of the piezo electric actuator, and
      determining the set-point voltage (Vx) based on the updated mathematical model, OP (V,T,n), and applying the set-point voltage (Vx) to the piezoelectric actuator.

2. The method according to claim 1, wherein the relationship describes the optical response for descending and/or ascending values of the voltage (V).

3. The method according to claim 2, wherein the relationship solely describes the optical response for descending or ascending values of the voltage (V).

4. The method according to claim 1, wherein determining the transition time count value (n) and the calibration transition time count value (nCAL) comprises determining a first transition time value (x1) between the first and second states (X1, X2), and determining a second transition time value (x2) between third and fourth states (X3, X4) of the piezo electric actuator, and wherein the transition time count value (n) and the calibration transition time count value (nCAL) are determined based on a ratio of the first and second transition time values (x1, ×2).

5. The method according to claim 1, wherein the first and second states (X1, X2) comprises first and second steady state voltages (V1, V2) resulting based on applying first and second voltages (V1, V2), to the piezoelectric actuator.

6. The method according to claim 5, wherein the first steady state voltage (V1) is higher than the second steady state voltage (V2) and wherein the transition time value (x) is obtained based on a transition from the first steady state voltage (V1) to the second steady state voltage (V2).

7. The method according to claim 1, wherein the curve fitting polynomial (L) is a predetermined nonlinear function of the voltage (V).

8. The method according to claim 1, wherein the mathematical model comprises the sum of a first term a(T)×L(V) and a second term b(T,C), wherein a(T) is a polynomial depending on the temperature parameter (T), a first calibration parameter (αCAL) and the actual temperature (Ta), wherein L(V) is a polynomial of at least 3rd order depending on the voltage (V), and wherein b(T,C) is a polynomial depending on the temperature parameter (T), the voltage (V), a second calibration parameter (bCAL), the actual temperature (Ta) and the actual capacitance parameter (Ca).

9. The method according to claim 1, wherein the mathematical model further comprises a term OPtherm (T) which describes an optical response variation due to temperature dependent components as a function of the temperature (T), wherein the optical lens system is optically connected with the piezoelectric actuator system.

10. The method according to claim 1, wherein applying the voltage to the piezoelectric actuator comprises initially applying a maximum or a minimum voltage (Vmax, Vmin) to the piezoelectric actuator for driving the piezoelectric actuator to maximum or minimum deformation, and subsequently applying the set-point voltage (Vx) to the piezoelectric actuator.

11. The method according to claim 1, wherein the set-point voltage (Vx) is determined in an open loop configuration independent on a measurement of an actual optical response (OP).

12. A piezoelectric actuator system comprising a piezoelectric actuator, a piezo driver configured to power the piezoelectric actuator, a processing unit configured to determine a set-point voltage (Vx) to be applied by the piezo driver to the piezoelectric actuator according to the method of claim 1, and the optical member with an adjustable optical response.

13. The piezoelectric actuator system according to claim 12, wherein the optical member comprises:
- a first transparent cover member,
- a second cover member, and
- a transparent, deformable, non-fluid body sandwiched between the first and second transparent cover members, wherein at least one of the piezoelectric elements of the piezoelectric actuator is configured to generate a controllable change of curvature, displacement and/or orientation of the first or the second cover member.

14. A camera module comprising a piezoelectric actuator system according to claim 13, wherein the piezoelectric actuator system comprises an optical lens, and wherein the camera module further comprises an image sensor configured to receive the light transmitted through the optical lens.

15. An electronic device comprising the piezoelectric actuator system according to any of claim 13.

* * * * *